(12) United States Patent
Ning

(10) Patent No.: US 7,286,573 B1
(45) Date of Patent: Oct. 23, 2007

(54) CONVERSION OF TYPE OF QUANTUM WELL STRUCTURE

(75) Inventor: Cun-Zheng Ning, San Jose, CA (US)

(73) Assignee: United States of America as Represented by the Administrator of the National Aeronautics and Space Administration (NASA), Washington, DC (US)

( * ) Notice: Subject to any disclaimer, the term of this patent is extended or adjusted under 35 U.S.C. 154(b) by 211 days.

(21) Appl. No.: 10/923,160

(22) Filed: Aug. 12, 2004

(51) Int. Cl.
*H01S 3/30* (2006.01)
*H01S 5/00* (2006.01)
*H01L 29/06* (2006.01)
*H01L 29/372* (2006.01)

(52) U.S. Cl. ............... 372/4; 372/45.01; 372/45.012; 257/14; 257/184; 977/755; 977/758; 977/820

(58) Field of Classification Search ............ 372/4, 372/45.01, 45.012; 257/13, 14, 22, 189, 257/184; 977/755, 758, 820
See application file for complete search history.

(56) References Cited

U.S. PATENT DOCUMENTS

| 5,588,015 | A  | * | 12/1996 | Yang ............... 372/45.012 |
| 5,793,787 | A  | * | 8/1998  | Meyer et al. ......... 372/45.01 |
| 5,799,026 | A  | * | 8/1998  | Meyer et al. ......... 372/45.01 |
| 5,995,529 | A  | * | 11/1999 | Kurtz et al. ......... 372/45.01 |
| 6,404,791 | B1 | * | 6/2002  | Yang ............... 372/45.01 |
| 6,500,688 | B2 |   | 12/2002 | Bruno et al. |
| 6,697,155 | B2 |   | 2/2004  | Dobbs et al. |
| 6,782,020 | B2 | * | 8/2004  | Scully et al. ......... 372/45.01 |
| 6,791,104 | B2 | * | 9/2004  | Tansu et al. ............ 257/14 |
| 6,898,215 | B2 | * | 5/2005  | Naone et al. ............ 372/4 |
| 2002/0131463 | A1 | * | 9/2002 | Bruno et al. ........... 372/45 |
| 2003/0072340 | A1 |  | 4/2003 | Mirov |
| 2003/0219052 | A1 | * | 11/2003 | Goodhue et al. ....... 372/45 |
| 2006/0025835 | A1 | * | 2/2006 | Calcott ............... 607/86 |

OTHER PUBLICATIONS

Bass, et al., Quantum Well Lasers, Handbook of Optics, vol. 1, Dec. 1, 1994, 13.10-13.19, McGraw-Hill, Inc., USA.
Bass, et al., Quantum Well and Strained Lasers, Handbook of Optics, vol. IV, Jan. 17, 2003, 4.28-4.34, McGraw-Hill Companies, Inc., USA.

(Continued)

*Primary Examiner*—Minsun Harvey
*Assistant Examiner*—Marcia A. Golub
(74) *Attorney, Agent, or Firm*—Robert M. Padilla; John F. Schipper

(57) ABSTRACT

A method for converting a Type 2 quantum well semiconductor material to a Type 1 material. A second layer of undoped material is placed between first and third layers of selectively doped material, which are separated from the second layer by undoped layers having small widths. Doping profiles are chosen so that a first electrical potential increment across a first layer-second layer interface is equal to a first selected value and/or a second electrical potential increment across a second layer-third layer interface is equal to a second selected value. The semiconductor structure thus produced is useful as a laser material and as an incident light detector material in various wavelength regions, such as a mid-infrared region.

9 Claims, 3 Drawing Sheets

OTHER PUBLICATIONS

Chow, et al., Mid-wave Infrared diode lasers based on GaInSb/InAs and InAs/AlSb superlatices, Appl. Phys. Lett., Dec. 18, 1995, 3700-3702, American Institute of Physics.

Hasenberg, et al., Recent Advances in Sb-Based Midwave-Infrared Lasers, IEEE Journal of Quantum Electronics, Aug. 1997, 1403-1406, 33-8, IEEE.

Kolokolov, et al., Doping-induced type-II to type-I transition and interband optical gain in InAs-Al . . . , Appl. Phys. Lett., Aug. 25, 2003, 83-8, American Institute of Physics.

Kolokolov, et al., Doping-induced type-II to type-I transition and Mid-IR Optical Gain in InAs/AlSb Qu . . ., SPIE 5365, 259-266, Feb. 12, 2004.

Ning, et al., Doping-induced Type-II to Type-I Transitions and Mid-IR Optical Gain in InAs/AlSb Quantum Wells, Proc. of Photonics West 2004, SPIE, Jan. 26-29, 2004.

Yariv, Advanced Semiconductor Laser: Quantum Well Lasers Distributed Feedback L . . ., Optical Electronics in Modern Communications, 1997, 605-638, Oxford University Press.

Yariv, Kramers-Kronig Relations, Optical Electronics in Modern Communications, 1997, Appendix A, Oxford University Press.

Doping-Induced Interband Gain in InAs/AlSb Quantum Wells, NASA Tech Briefs, Jan. 2005, Look Smart Find Articles, Free Reference and Education.

\* cited by examiner

CONVERSION OF TYPE OF QUANTUM WELL STRUCTURE

ORIGIN OF THE INVENTION

The invention described herein was made in the performance of work under a N.A.S.A. contract and is subject to the provisions of Section 305 of the National Aeronautics and Space Act of 1958, as amended, Public Law 85-568 (72 Stat. 435; 42 U.S.C. §2457).

FIELD OF THE INVENTION

This invention relates to conversion of quantum well structures from one type to another type with higher optical transition strength.

BACKGROUND OF THE INVENTION

A semiconductor quantum well (QW) can be broadly classified as Type 1 (electron and hole wave functions overlap substantially) and Type 2 (electron and hole wave functions are substantially non-overlapping). Either type of QW relies upon decay of (free) electrons into (vacant) holes and thus upon overlap of the electron and hole wavefunctions near the recombination region so that a Type 2 QW structure will generally have a much smaller optical gain or associated electron-hole current than does a Type I QW structure. A semiconductor material such as InAs has an attractive band gap in the mid-infrared region, but materials such as AlSb/InAs in a conventional configuration appear to have only Type II band edge lineups. This precludes use of InAs, in a conventional QW configuration, from being used to produce, or to detect, light of mid-infrared wavelengths.

What is needed is an approach for converting a Type II QW material in to Type I QW material. Preferably, this approach should be flexible and should provide a spectrum of emission wavelengths in a selected wavelength band, such as a mid-infrared band. Preferably, this approach should work with a variety of choices of column III and column V semiconductor materials and with a continuum of geometric parameters associated with the QW wells. Preferably, this approach should allow use of the converted material for detection of the presence of light and/or for production of light in a specified wavelength band.

SUMMARY OF THE INVENTION

These needs are met by the invention, which provides an N-layer QW structure, with $N \geq 5$. In one embodiment, a five-layer semiconductor structure is provided, where the individual layers are doped, undoped, active, undoped and doped in that order, and the doping levels, location and widths of the two doped layers are chosen so that overlap of electron and hole wavefunctions are sufficiently strong to have high optical transition strength.

One example, using InAs for the active region and AlSb for the doped regions is found to provide a type 1 QW structure with adequate optical gain. The valence band offset between AlSb and InAs is taken to be 180 meV, which is the upper limit in the range of uncertainty. Proper doping in the heterostructure converts the InAs layer to a well for holes so that a Type II QW structure is thereby converted to a Type I QW structure. Both dipole moments and optical gain increase significantly with increasing doping.

DESCRIPTION OF BEST MODES OF THE INVENTION

Figure 1:
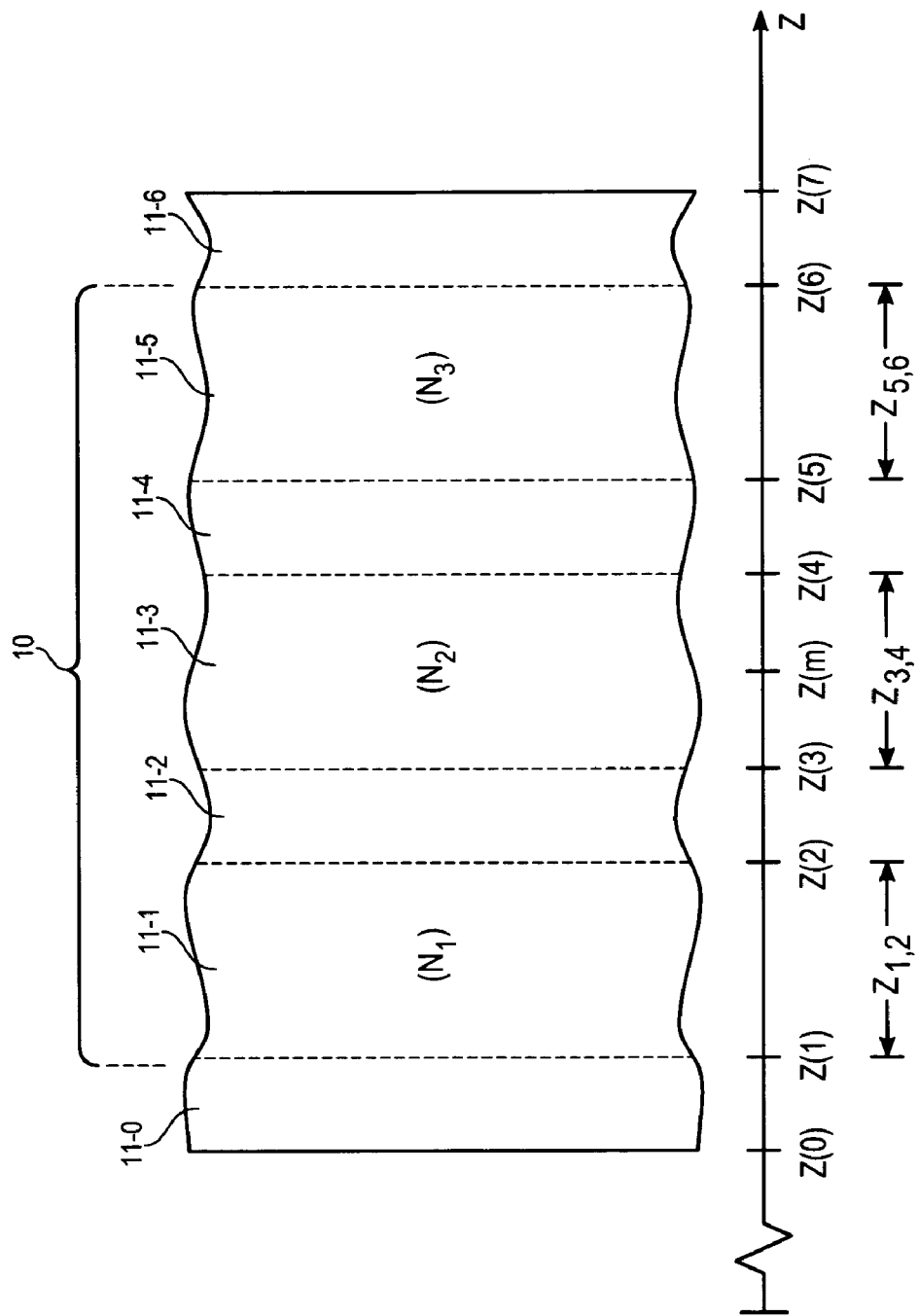
FIG. 1 schematically illustrates construction of a five-layer, a six-layer and a seven-layer QW semiconductor structure, according to the invention.

In one embodiment, a five-layer QW semiconductor structure 10 is constructed as illustrated in FIG. 1. Second and fourth layers, 11-2 and 11-4, are undoped III–V materials ($\rho=0$), such as AlSb or Al$_x$Ga$_{1-x}$Sb, ($0<x\leq 1$) and have the respective widths h(i) (i=2,4), which may have equal or unequal values. The first and fifth layers, 11-1 and 11-5, are uniformly doped ($\rho=\rho 1$ and $\rho=\rho 5$) with selected III–V donor materials and have widths h(i) (i=1,5), which may be equal or unequal. The third layer 11-3 is electron-rich (effectively, negatively charged) active material, such as InAs$_y$Sb$_{1-y}$, ($0.7<y\leq 1$), with a width h(3) and acts as a "sink" or attractor for holes produced in the doped layers 1 and 5. An undoped layer 11-0 and/or an undoped layer 11-6 are optionally included but are not part of the basic structure 10. A coordinate z is measured transverse to the layer-to-layer interfaces so that the layer widths are $$h(i)=z(i+1)-z(i)=z_{i,i+1} (i=0,1,\ldots,5). \quad (1)$$

The layer thicknesses are optionally the same.

The electrical charges associated with the five layers of the structure 10 are $$\begin{aligned}\rho(z) &= eN_1 & (z(1)<z<z(2)), \\ &= 0 & (z(2)<z<z(3)), \\ &= -eN_2 & (z(3)<z\leq z(m),\, z(m)\leq z<z(4)), \\ &= 0 & (z(4)<z<z(5)), \\ &= eN_3 & (z(5)<z\leq z(6)),\end{aligned} \quad (2)$$

$$h(1)=z(2)-z(1)=z_{1,2}, \quad (3)$$

$$h(3)=z(4)-z(3)=z_{3,4}, \quad (4)$$

where $N_1$, $N_2$ and $N_3$ are the donor doping densities in layers 11-1, 11-3 and 11-5, with $N_2$ optionally 0. Charge neutrality in the structure 10 requires that $$z_{1,2}N_1+z_{5,6}N_3=z_{3,4}N_2. \quad (5)$$

From Poisson's equation, the associated electrical fields E(z) within each of the layers 11-1, 11-2 and 11-3 are determined by $$\begin{aligned}\varepsilon_0\varepsilon_r E(z) &= \int_0^z \rho(z)dz & (6)\\ &= eN_1(z-z(1)) & (z(1)<z<z(2)) \\ &= eN_1 z_{1,2} & (z(2)<z<z(3)) \\ &= -(z_{1,2}N_1+z_{5,6}N_3)(z- & (z(3)<z\leq z(m)), \\ & \quad z(3))/z_{3,4}+eN_1 z_{1,2}\end{aligned}$$

where $\varepsilon_r$ (>1) is a relative dielectric parameter for the layer material (e.g., $\varepsilon_r=12$ and $\varepsilon_r=15.15$ for AlSb and InAs, respectively).

The electrical potentials V(z), illustrated in FIG. 2, within each of the layers 11-1, 11-2 and 11-3 are determined by integrals over the appropriate ranges $$\varepsilon_0\varepsilon_b V(z) = \int_0^z \varepsilon_0\varepsilon_r eE(z')dz' \quad (7)$$

$$= 0 \quad (z < z(1))$$

$$= e^2 N_1(z - z(1))^2/2 \quad (z(1) < z < z(2))$$

$$= e^2 N_1(z_{1,2})(z - z(2)) \quad (z(2) < z < z(3))$$

$$= -e^2(N_1 z_{1,2} + N_3 z_{5,6})(z - z(3))^2/ \quad (z(3) < z < z(m)).$$

$$2z_{3,4} + e^2 N_1 z_{1,2}(z - z(3))$$

Figure 2A:
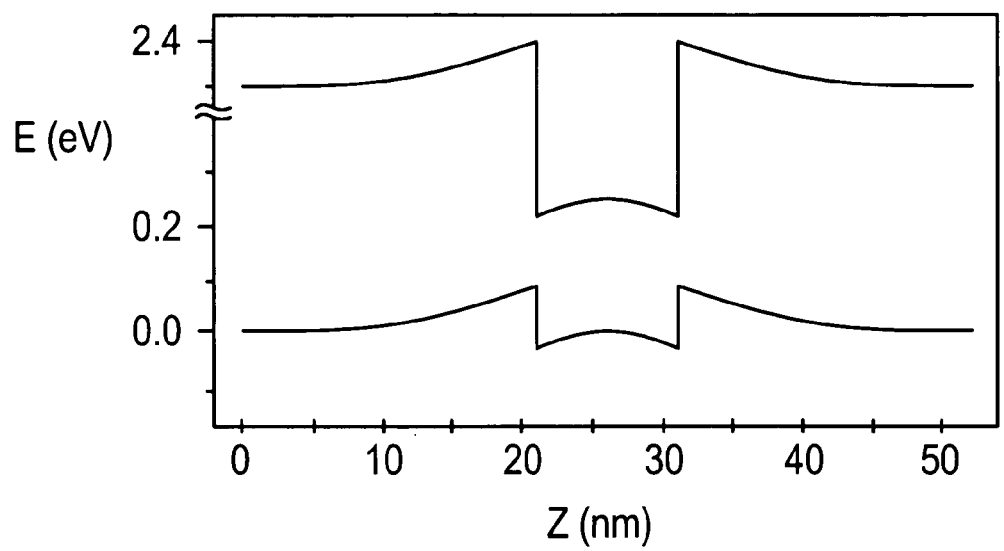
FIGS. 2A and 2B graphically illustrate the conduction and valence band edge energy profiles for a seven layer structure of FIG. 1, for different doping levels.
Figure 2B:
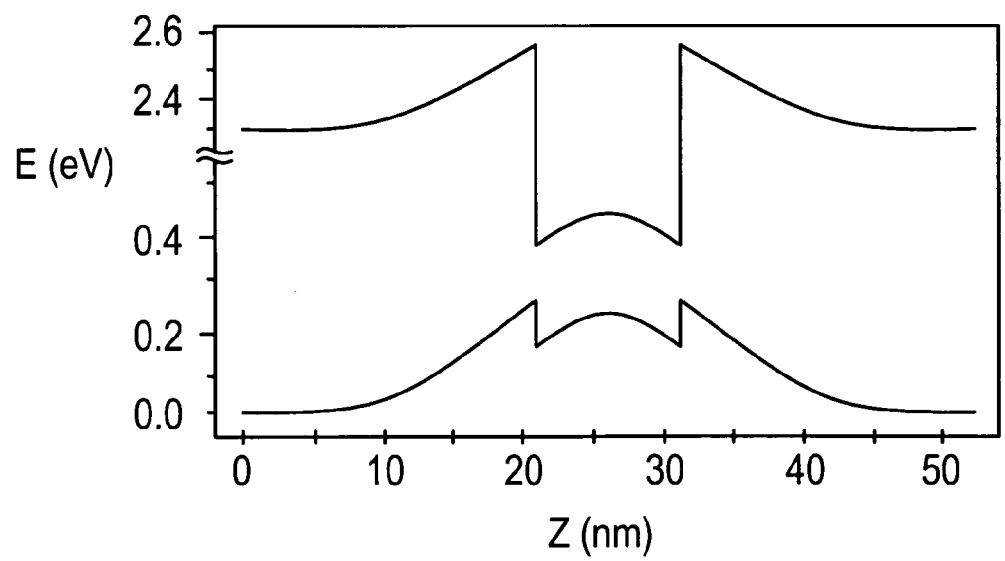

FIGS. 2A and 2B graphically illustrate bulk band edge profiles with doping area densities of $0.5\times10^{12}$ cm$^{-2}$ and $3\times10^{12}$ cm$^{-2}$, respectively, and with the layer thicknesses as indicated in FIG. 1. Where the doping area density is relatively low, as in FIG. 2A, the barriers are too high for an appreciable number of holes to relocate to the active region. However, as the doping area density increases, as indicated in FIG. 2B, an optimal density level is reached, where the valence band for InAs is pushed up to and above the original AlSb valence band edge. At this point, a substantial fraction of the holes originally in the AlSb layers can migrate to the InAs layer and thereby convert the Type II QW structure into a Type I QW structure.

The maximum barrier height for holes in the region $z(3)<z<z(4)$ is estimated as $V_{eff} \approx 180$ meV. At the interface $z=z(3)-0$, $$V(z(3)-0)=e^2 N_d z_{1,2} z_{2,3}/(\varepsilon_0 \varepsilon_b), \quad (8)$$

and the hole barrier height at this interface will become 0 if $V(z(3)-0)=V_{eff}$. The maximum value of the hole potential occurs at $z=z(m)=(z(3)+z(4))/2$, where $$V(z(m);\text{hole})=(e^2 z_{3,4}/2\varepsilon_0\varepsilon_b)\{-(N_1 z_{1,2}+N_3 z_{5,6})/4+N_1 z_{1,2}\}. \quad (9)$$

The remaining portion of the QW layers, $z(m) \leq z \leq z(6)$, is constructed by analogy to the first portion, $z(1) \leq z \leq z(m)$. When $V(z(m);\text{total})=V_{eff}$ or $V(z(m);\text{total})>V_{eff}$, the total electrical potential V(z) behaves as illustrated in FIG. 2B for a symmetrical structure. For example, with $z_{1,2}=10$ nm, $z_{2,3}=5$ nm, $z_{3,4}=1-30$ nm, $N_d=10^{18}$ cm$^{-3}$ and $\varepsilon_r=10$, V(z(3))=181 meV, which is already close to the target value of 180 meV. The structure 10 in FIG. 1 may be symmetric or non-symmetric. Here, the layers 11-1 and 11-3 have doping densities of $10^{18}$ cm$^{-3}$ or of $3\times10^{18}$ cm$^{-3}$.

By reducing or eliminating the hole barrier at the interface $z=z(3)$ (and similarly at $z=z(4)$), the hole wavefunctions are permitted to substantially overlap with the electron wavefunctions, and the structure 10 in FIG. 1 becomes a Type I QW structure, where the optical field is preferably polarized in the z-direction and propagates primarily within the third layer material (e.g., InAs). Where the third layer material is InAs, the band gap lies in the mid-infrared range so that wavelengths produced or sensed in this range may be provided.

FIG. 1 also illustrates a six-layer structure, defined by $z(0) \leq z \leq z(6)$ or by $z(1) \leq z \leq z(7)$, where the added layer, 11-0 or 11-6, has zero doping. The results at the interfaces, $z=z(3)$ and $z=z(4)$, are the same: a Type II QW structure is converted into a Type I QW structure.

FIG. 1 also illustrates a seven-layer structure, defined by $z(0) \leq z \leq z(7)$, where each of the added layers, 11-0 and 11-6, has zero doping. The results at the interfaces, $z=z(3)$ and $z=z(4)$, are the same: a Type II QW structure is converted into a Type I QW structure.

Figure 3A:
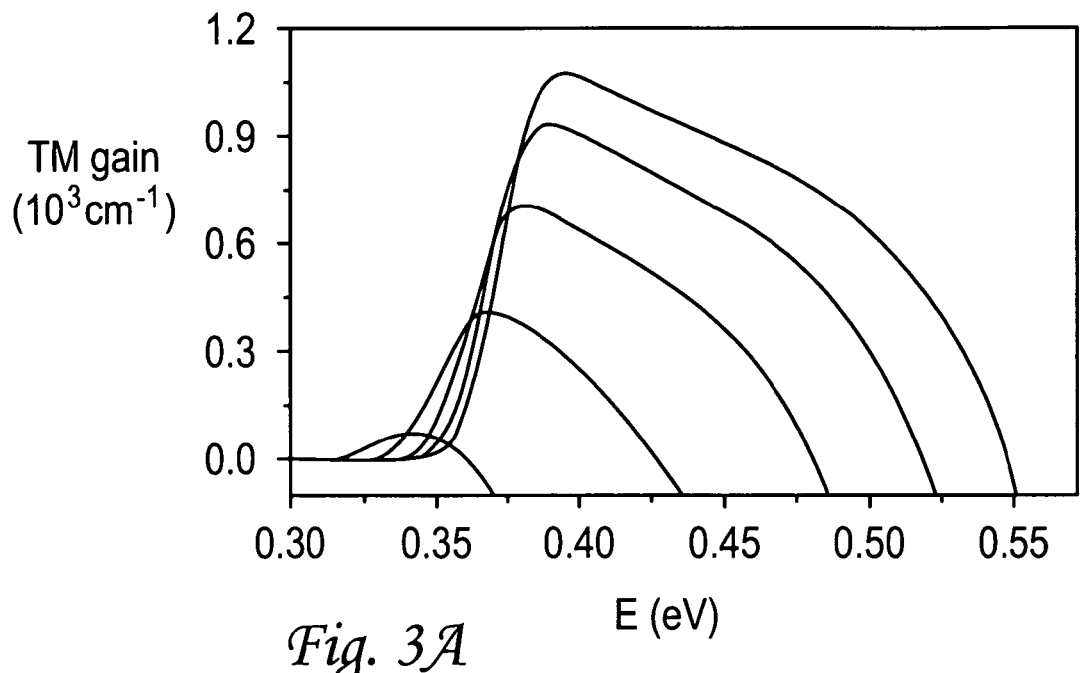
FIGS. 3A and 3B graphically illustrate computed gain spectra for electron-hole density of $10^{12}$ cm$^{-2}$ for different doping densities.
Figure 3B:
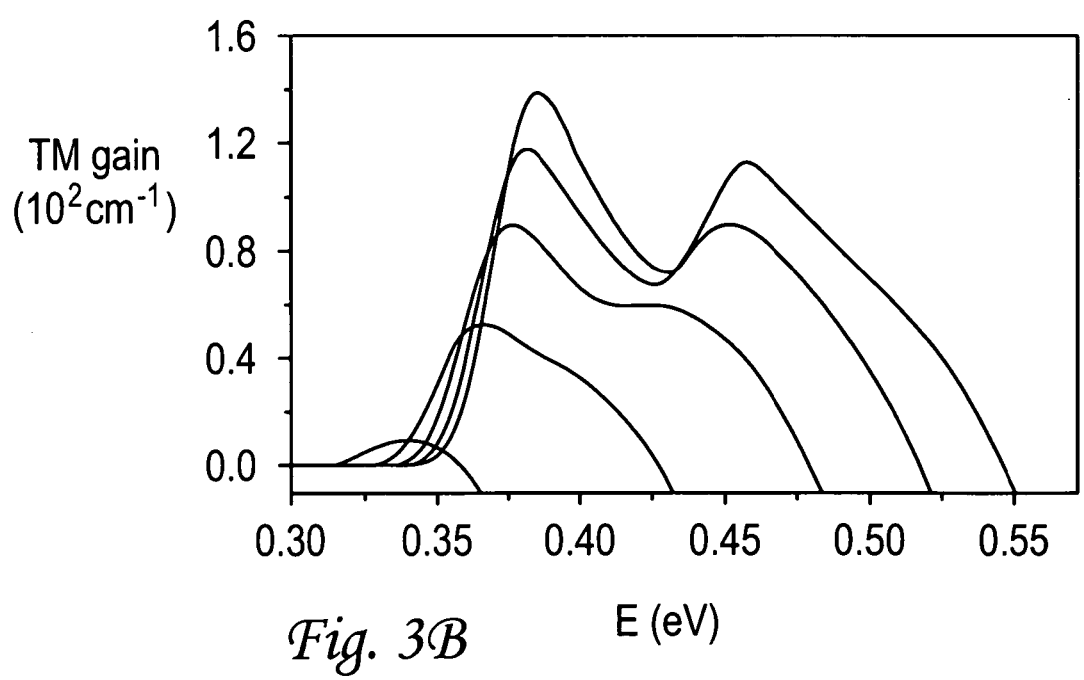

FIGS. 3A and 3B graphically illustrate computed gain spectra for a hole density of $10^{12}$ cm$^{-2}$ for doping densities of (1, 2, 3, 4, 5)$\times10^{12}$ cm$^{-2}$, for a TM mode and for a TE mode, with differing scales for the two modes, using an assumed Gaussian lineshape with a homogeneous linewidth of 10 meV. The calculated gain will increase as the linewidth decreases. Peak gain amplitude generally increases for increased doping density. The significant gain in peak gain Amplitude with doping density arises primarily from increases in the number of charged particles and the increase in overlap of the electron and hole wavefunctions. Saturation of the peak gain amplitude is not manifest at these doping densities.

The QW structure shown in FIG. 1 can serve as a laser material that produces mid-infrared wavelength laser light, and can serve as a photodetector material for production of electron hole pairs in response to receipt of mid-infrared (and lower) wavelengths.

What is claimed is:

1. A method for converting a Type II quantum well (QW) structure including III–V semiconductor material to a Type I QW structure, the method comprising:

providing first and third spaced apart layers of respective first and third III–V semiconductor donor materials, having selected first layer and third layer widths, respectively, each in a width range of about 1–30 nm;

providing a second layer of a second III–V semiconductor material, contiguous to and lying between the first layer and the third layer, having a selected second layer width in a width range of about 1–30 nm and having a selected negative potential relative to potentials of the first layer and the third layer;

doping a first layer first component, having a width that is less than the first layer width and is in a width range of about 1–20 nm, with a first layer doping level in a doping range of about $(1-100)\times10^{11}$ cm$^{-2}$, and providing a first layer second component that is substantially undoped and lies between and is contiguous to the first layer first component and to the second layer; and doping a third layer first component, having a width that is less than the third layer width and is in a width range of about 1–20 nm, with a third layer doping level in a doping range of about $(1-100)\times10^{11}$ cm$^{-2}$, and providing a third layer second component that is substantially undoped and lies between and is contiguous to the third layer first component and to the second layer, wherein at least one of the following conditions is satisfied: (i) the first layer is primarily $Al_xGa_{1-x}Sb$, with $0<x<1$; (ii) the second layer is primarily $InAs_ySb_{1-y}$, with $0.7<y<1$; (iii)) the third layer is primarily $Al_zGa_{1-z}Sb$, with $0<z<1$; (iy) the first layer first component width and the third layer first component width are unequal; (v) the first layer second component width and the third layer second component width are unequal; and (vi) the first layer and third layer semiconductor materials are substantially different;

where the first layer first component and third layer first component doping levels and the first layer and third layer widths are chosen so that at least one of the following conditions is satisfied: (1) a change in electrical potential across an interface between the first and second layers is equal to a first selected potential value and (2) a change in electrical potential across an interface between the second and third layers is equal to a second selected potential value.

2. The method of claim 1, further comprising applying a structure comprising said first, second and third layers to at least one of the following: (1) as, a laser material, to provide at least one laser emission wavelength in a mid-infrared wavelength region; and (2) as a photodetector material, to provide an electron-hole current in response to receipt of light having a wavelength no greater than a mid-infrared wavelength.

3. Apparatus for providing or detecting presence of light in a mid-infrared wavelength region, the apparatus comprising:

first and third spaced apart layers of respective first and third III–V semiconductor donor materials, having selected first layer and third layer widths, respectively, each in a width range of about 1–30 nm;

a second layer of a second III–V semiconductor material, located contiguous to and lying between the first layer and the third layer, having a selected second layer width in a width range of about 1–30 nm and having a selected negative potential relative to potentials of the first layer and the third layer, where the first layer: has a first layer first component, having a width that is less than the first layer width and is in a width range of about 1–20 nm, with a first layer doping level in a doping range of about $(1-100) \times 10^{11}$ $cm^{-2}$; and has a first layer second component that is substantially undoped and lies between and is contiguous to the first layer first component and to the second layer; and where the third layer: has a third layer first component, having a width that is less than the third layer width and is in a width range of about 1–20 nm, with a third layer doping level in a doping range of about $(1-100) \times 10^{11}$ $cm^{-2}$; and has a third layer second component that is substantially undoped and lies between and is contiguous to the third layer first component and to the second layer, where the first layer first component and third layer first component doping levels and the first layer and third layer widths are chosen so that at least one of the following conditions is satisfied: (1) a change in electrical potential across an interface between the first and second layers is equal to a first selected potential value and (2) a change in electrical potential across an interface between the second and third layers is equal to a second selected potential value.

4. The apparatus of claim 3, incorporated in a structure as a laser material, to provide at least one laser emission wavelength in a mid-infrared wavelength region.

5. The apparatus of claim 3, incorporated in a structure as a photodetector material, to provide an electron-hole current in response to receipt of light having a wavelength no greater than a mid-infrared wavelength.

6. A method for converting a Type II quantum well (QW) structure including III-V semiconductor material to a Type I QW structure, the method comprising:

providing first and third spaced apart layers of respective first and third III-V semiconductor donor materials, having selected first layer and third layer widths, respectively, each in a width range of about 1–30 nm;

providing a second layer of a second III-V semiconductor material, contiguous to and lying between the first layer and the third layer, having a selected second layer width in a width range of about 1-30 nm and having a selected negative potential relative to potentials of the first layer and the third layer wherein the first layer second component width and the third layer second component width are unequal;

doping a first layer first component, having a width that is than the first layer width and is in a width range of about 1-20 nm, with a first layer doping level in a doping range of about $(1-100) \times 10^{11}$ $cm^{-2}$, and providing a first layer second component that is substantially undoped and lies between and is contiguous to the first layer first component and to the second layer; and providing a fourth layer of semiconductor material, having a selected fourth layer width, substantially undoped and contiguous to the first layer first component, so that the first layer first component lies between the fourth layer and the first layer second component;

doping a third layer first component, having a width that is less than the third layer width and is in a width range of about 1-20 nm, with a third layer doping level in a doping range of about $(1-100) \times 10^{11}$ $cm^{-2}$, and providing a third layer second component that is substantially undoped and lies between and is contiguous to the third layer first component and to the second layer, and where the first layer first component and third layer first component doping levels and the first layer and third layer widths are chosen so that at least one of the following conditions is satisfied: (1) a change in electrical potential across an interface between the first and second layers is equal to a first selected potential value and (2) a change in electrical potential across an interface between the second and third layers is equal to a second selected potential value.

7. The method of claim 6, further comprising providing a fifth layer of semiconductor material, having a selected fifth layer width and being substantially undoped, contiguous to said third layer first component so that said third layer first component lies between the fifth layer and said third layer second component.

8. Apparatus for providing or detecting presence of light in a mid-infrared wavelength region, the apparatus comprising:

first and third spaced apart layers of respective first and third III-V semiconductor donor materials, having selected first layer and third layer widths, respectively, each in a width range of about 1-30;

a second layer of a second III-V semiconductor material, located contiguous to and lying between the first layer and the third layer, having a selected second layer width in a width range of about 1-30 nm and having a selected negative potential relative to potentials of the first layer and the third layer;

where the first layer: has a first layer first component, having a width that is less than the first layer width and is in a width range of about 1-20 nm, with a first layer doping level in a doping range of about $(1-100) \times 10^{11}$ $cm^{-2}$; and has a first layer second component that is substantially undoped and lies between and is contiguous to the first layer first component and to the second layer; layer second component that is substantially undoped and lies between and is contiguous to the first layer first component and to the second layer;

a fourth layer of semiconductor material, having a selected fourth layer width, substantially undoped and contiguous to the first layer first component, so that the first layer first component lies between the fourth layer and the first layre second component;

where the third layer: has a third layer first component, having a width that is less than the third layer width and is in a width range of about 1-20 nm, with a third layer doping level in a doping range of about $(1-100) \times 10^{11}$ cm$^{-2}$; and has a third layer second component that is substantially undoped and lies between and is contiguous to the third layer first component and to the second layer, and where the first layer first component and third layer first component doping levels and the first layer and third layer widths are chosen so that at least one of the following conditions is satisfied: (1) a change in electrical potential across an interface between the first and second layers is equal to a first selected potential value and (2) a change in electrical potential across an interface between the second and third layers is equal to a second selected potential value.

9. The apparatus of claim 7, further comprising a fifth layer of semiconductor material, having a selected fifth layer width and being substantially undoped and located contiguous to said third layer first component so that said third layer first component lies between the fifth layer and said third layer second component.

* * * * *